(12) United States Patent
Lee et al.

(10) Patent No.: US 12,069,835 B2
(45) Date of Patent: Aug. 20, 2024

(54) HEAT SINK AND CONVERTER COMPRISING SAME

(71) Applicant: LG INNOTEK CO., LTD., Seoul (KR)

(72) Inventors: Yong Joo Lee, Seoul (KR); Mi Sun Lee, Seoul (KR); Ju Young Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 204 days.

(21) Appl. No.: 17/919,321

(22) PCT Filed: Apr. 16, 2021

(86) PCT No.: PCT/KR2021/004827
§ 371 (c)(1),
(2) Date: Oct. 17, 2022

(87) PCT Pub. No.: WO2021/210957
PCT Pub. Date: Oct. 21, 2021

(65) Prior Publication Data
US 2023/0156964 A1    May 18, 2023

(30) Foreign Application Priority Data

Apr. 17, 2020 (KR) ........................ 10-2020-0046857

(51) Int. Cl.
*H05K 7/20* (2006.01)
*H02M 3/00* (2006.01)

(52) U.S. Cl.
CPC .......... *H05K 7/20336* (2013.01); *H02M 3/00* (2013.01); *H05K 7/20936* (2013.01)

(58) Field of Classification Search
CPC .. H05K 7/20336; H05K 7/20936; H02M 3/00
See application file for complete search history.

(56) References Cited

U.S. PATENT DOCUMENTS

| 6,633,485 B1 | 10/2003 | Sigl et al. |
| 2006/0060328 A1* | 3/2006 | Ewes ................. H01L 23/4338 165/185 |
| 2009/0085187 A1 | 4/2009 | Scott et al. |

(Continued)

FOREIGN PATENT DOCUMENTS

| KR | 10-2014-0018115 | 2/2014 |
| KR | 10-2016-0044052 | 4/2016 |
| KR | 10-2081928 | 2/2020 |

OTHER PUBLICATIONS

International Search Report dated Jul. 29, 2021 issued in Application No. PCT/KR2021/004827.

*Primary Examiner* — Mukundbhai G Patel
(74) *Attorney, Agent, or Firm* — KED & ASSOCIATES, LLP

(57) ABSTRACT

A heat sink according to one embodiment of the present invention comprises: a main heat sink; a heat pipe mounted in a groove formed on one surface of the main heat sink; a heat dissipation member which is formed above the heat pipe and transfers heat generated from a heat generation component to the heat pipe; and an elastic member which is mounted in a space formed inside the heat dissipation member and applies pressure to the main heat sink.

20 Claims, 7 Drawing Sheets

(56) References Cited

U.S. PATENT DOCUMENTS

2012/0085520 A1* 4/2012 Pfaffinger ............. H01L 23/433
                                                    165/104.26
2014/0036445 A1* 2/2014 Okamoto ............ H01L 23/4006
                                                    165/185

* cited by examiner

HEAT SINK AND CONVERTER COMPRISING SAME

CROSS-REFERENCE TO RELATED PATENT APPLICATIONS

This application is a U.S. National Stage Application under 35 U.S.C. § 371 of PCT Application No. PCT/KR2021/004827, filed Apr. 16, 2021, which claims priority to Korean Patent Application No. 10-2020-0046857, filed Apr. 17, 2020, whose entire disclosures are hereby incorporated by reference.

TECHNICAL FIELD

The present invention relates to a heat sink, and more particularly, to a heat sink including a heat pipe and a converter module comprising the same.

BACKGROUND ART

In order to dissipate heat from products that generate a lot of heat, such as converters, various methods such as various fins and fans, thermoelectric elements, cooling water circulation, and heat pipes have been used.

The heat dissipation fin is a heat exchange device being formed in the form of a plurality of thin plates in order to enlarge the heat dissipation surface, and a heat pipe is a pipe-shaped heat exchange device that includes a working fluid inside to efficiently transfer heat between an interface between two solids by combining the principles of thermal conductivity and phase transition.

When a heat dissipation fin is used for heat dissipation of a DC-DC converter installed in a battery pack, the heat dissipation fin is exposed to the outside and there is a risk of burns when touched by a person's hand. In order to prevent the risk of burns, the battery pack should be placed in a position where a person's hand does not touch the heat dissipation fins, or a notice warning the risk of burns must be attached.

A heat dissipation method is required to prevent such a risk of burns.

DETAILED DESCRIPTION OF THE INVENTION

Technical Subject

The technical problem to be solved by the present invention is to provide a heat dissipation substrate including a heat pipe and a method of manufacturing the heat dissipation substrate.

The subjects of the present invention are not limited to the subjects mentioned above, and other subjects not mentioned will be clearly understood by those skilled in the art from the following description.

Technical Solution

In order to solve the above technical problem, a heat sink according to an embodiment of the present invention comprises: a main heat sink; a heat pipe being mounted in a groove being formed on one surface of the main heat sink; a heat dissipation member being formed at an upper portion of the heat pipe to transfer heat being generated in the heat generation component to the heat pipe; and an elastic member being mounted in a space formed inside the heat dissipation member for applying pressure to the main heat sink.

In addition, the elastic member may include: an elastic unit being contracted by a pressure applied when the heat dissipation member and the main heat sink are coupled to each other; and a pressure pressing unit for applying a pressure being condensed according to the contraction of the elastic unit to the main heat sink.

In addition, the thickness of a portion of the main heat sink to which pressure is applied by the elastic member may be thinner than the thickness of other portions.

In addition, it may include a battery pack 900 coupling the heat dissipation member and the main heat sink.

In addition, it may include a thermally conductive pad being formed at an upper portion of the heat dissipation member to transfer heat being generated in the heat generation component to the heat dissipation member.

In addition, it may include a heat dissipation fin being disposed in other surface of the main heat sink.

In addition, an extension direction of the heat dissipation fin may be the same as an extension direction of the heat pipe.

In order to solve the above technical problem, a converter module according to an embodiment of the present invention comprises: a printed circuit board on which a plurality of components performing voltage conversion are mounted; a heat sink that serves as a contact surface in contact with the external device when the converter module is mounted on an external device and radiates heat being generated in the component; and a housing covering the outside of the converter module, wherein the heat sink comprises: a main heat sink; a heat pipe being mounted in a groove being formed on one surface of the main heat sink; a heat dissipation member being formed at an upper portion of the heat pipe to transfer heat being generated in the component to the heat pipe; and an elastic member being mounted in a space formed inside the heat dissipation member to apply pressure to the main heat sink, and wherein the main heat sink is in contact with a contact surface of an external device to which the converter module is mounted by the pressure applied from the elastic member.

In addition, at least some components among the plurality of components is disposed at a position corresponding to a lower portion when the converter module is mounted on an external device, and the extension direction of the heat pipe may be disposed in an up and down direction when the converter module is mounted on an external device.

In addition, the elastic member may include: an elastic unit being contracted by pressure being applied when the heat dissipation member and the main heat sink are coupled; and a pressure pressing unit for applying a pressure being condensed according to the contraction of the elastic unit to the main heat sink.

In addition, the thickness of a portion to which pressure is applied by the elastic member of the main heat sink may be thinner than the thickness of other portions.

Advantageous Effects

According to embodiments of the present invention, it is possible to increase safety for users by preventing the risk of burns, and it is possible to make the product slimmer and lighter.

The effect according to the invention is not limited by the contents exemplified above, and more various effects are included in the present specification.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
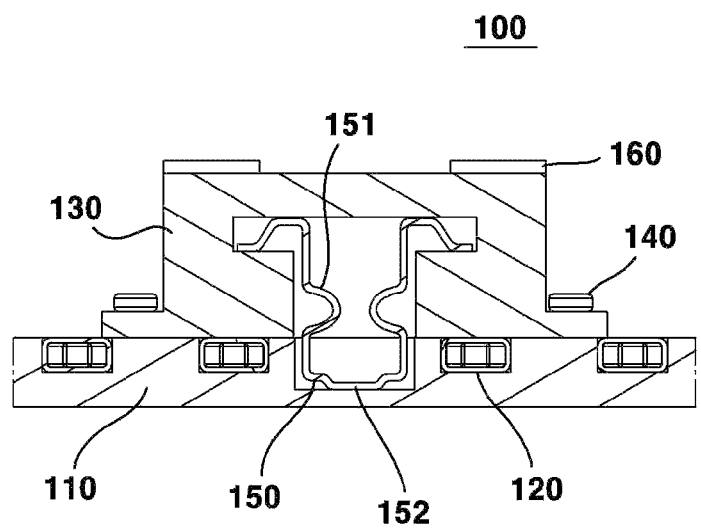
FIG. 1 illustrates a heat sink according to an embodiment of the present invention.

FIG. 1 illustrates a heat sink according to an embodiment of the present invention.

The heat sink 100 according to an embodiment of the present invention comprises: a main heat sink 110; a heat pipe 120, a heat dissipation member 130, and an elastic member 150, and it may include a battery packs 900 and 140, and a heat conduction pad 160.

A groove being formed on one surface is formed in the main heat sink 110, and the heat pipe 120 is mounted in the groove. The cross-sectional area of the groove being formed in the main heat sink 110 is the same as the heat pipe 120 or is formed as wide as a predetermined value, and the heat pipe 120 is press-fitted into the groove to be closely in contact with an inner surface of the groove, and is mounted on the heat sink 100. The heat pipe 120 may be press-fitted into the groove to have the same height as the height of the main heat sink 110.

Since the heat dissipation efficiency is increased by using the heat pipe 120, sufficient heat dissipation is possible without using the heat dissipation fins. When using a heat sink fin, the heat sink fin must be exposed to the outside, but since there is no need to use a heat dissipation fin by using the heat pipe 120, the module including the heat sink 100 can be mounted inside the packaged product without exposing to the outside. Through this, the safety is increased, and it is possible to make the product slimmer and lighter.

The heat dissipation member 130 is formed at an upper portion of the heat pipe 120 to transfer heat being generated in the heat generation component to the heat pipe 120. The heat dissipation member 130 is formed at an upper portion of the heat pipe 120 to transfer heat generated in a heat generation component that is not in direct contact with the main heat sink 110 on which the heat pipe 120 is formed to the heat pipe 120. Here, the heat dissipation member 130 may serve as a sub heat sink. The heat dissipation member 130 may be formed of a metal having high thermal conductivity, such as aluminum. The height of the heat dissipation member 130 may vary depending on the distance between the heat sink 100 and the heat generation component.

Figure 2:
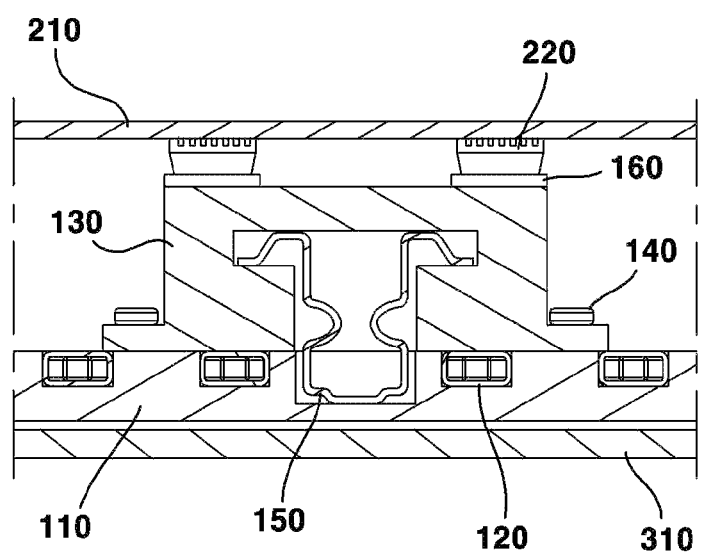
FIG. 2 illustrates a converter module to which a heat sink according to an embodiment of the present invention is applied.

The heat dissipation member 130 may be coupled to the main heat sink 110 through the battery packs 900 and 140. The heat dissipation member 130 may be coupled to the main heat sink 110 through screw-coupling using a plurality of battery packs 900 and 140 as shown in FIG. 2. At this time, the battery pack 900 may be formed to have a coupling force that can withstand the pressure to expand the elastic member 150 being generated during coupling. The battery packs 900 and 140 may be coupled in various ways, such as a member capable of fit-coupling together.

The elastic member 150 is mounted in the space formed inside the heat dissipation member 130 and applies pressure to the main heat sink 110. An internal space in which the elastic member 150 can be mounted is formed inside the heat dissipation member 130, and the elastic member 150 is mounted in the internal space of the heat dissipation member 130, but it is contracted by a pressure applied thereto when the heat dissipation member 130 is coupled to the main heat sink 110, and a pressure condensed according to the contraction, that is, a force to be expanded, is applied to the main heat sink 110.

The elastic member 150 may include: an elastic unit 151 being contracted by the pressure applied when the heat dissipation member 130 and the main heat sink 110 are coupled; and a pressure pressing unit 152 that applies a pressure being condensed according to the contraction of the elastic unit 151 to the main heat sink. The elastic unit 151 has a fan shape, but it may be deformed into an elliptical shape when contracted.

The elastic member 150 may be formed of a material having elasticity. For example, it may be formed of a metal material such as SUS, or may be formed of various other materials having elasticity. Since the elastic member 150 is in contact with the heat dissipation member 130 and the main heat sink 110, it may be formed of a material having high thermal conductivity. Through this, not only pressure transfer but also heat conduction may be performed. The application of pressure by the elastic member 150 to the main heat sink 110 will be described in detail later.

As shown in FIG. 2, the heat sink 100 according to an embodiment of the present invention may be applied to a product.

The heat sink 100 may be applied to, for example, a DC-DC converter that transmits power to a battery cell, and serves to reduce heat generated from a heat generation component of the DC-DC converter. A DC-DC converter includes various components such as a switch, a coil forming a transformer, and a capacitor. In particular, a lot of heat is generated in the coil and switch, and the coil and the switch have different product sizes, and as shown in FIG. 2, the FET being used as the switch has a considerably smaller product size than the coil. Therefore, the coil may be in direct contact with the heat sink 100, but components such as switches are difficult to be directly in contact with the main heat sink 110, so it must be in indirect contact with the main heat sink 110, in which the heat pipe 120 is mounted, through the heat dissipation member 130.

The heat generation component 220, such as a switch being mounted on the printed circuit board 210, transfers heat to the heat pipe 120 through the heat dissipation member 130. At this time, a heat conduction pad 160 may be included between the heat generation component 220 and the heat dissipation member 130. A thermal pad is a pad made of a material with high thermal conductivity, and it is formed between the heat generation component 220 and the heat dissipation member 130, it acts as a buffer between the heat generation component 220 and the heat dissipation member 130 while transferring heat being generated in the heat generation component 220 to the heat dissipation member 130.

The heat transferred from the heat generation component 220 to the main heat sink 110 in which the heat pipe 120 is formed through the heat conduction pad 160 and the heat dissipation member 130 is discharged to the outside, and at this time, if the product to which the heat sink 100 is applied is a single package module, heat must be transferred to the outside through the surface of the external device on which the package module is mounted. For example, a product to which the heat sink 100 is applied may be a DC-DC converter module being mounted on a battery pack. The heat sink 100 transfers heat being generated in a DC-DC converter module to the housing of the battery pack, so that it is discharged to the outside through the housing of the battery pack. For this, the heat sink 100 must be in contact with the housing of the battery pack, and the contact should be maintained. An elastic member 150 is used so as to maintain the contact with the contact surface 310 of an external device such as a housing of a battery pack.

The heat dissipation member 130 may not be applied one by one to correspond to one component 220, but may be formed to correspond to a plurality of components 220. Since it is formed to correspond to a plurality of parts, it may be formed to a size that can form an internal space, and through this, it is possible to form a sufficient internal space in which the elastic member can be formed. For example, as shown in FIG. 2, the heat dissipation member 130 may be formed at a lower portion of two or more components, and it may be formed at a lower portion of a plurality of components, such as four or six. The inner space may be formed in a groove shape. A locking step or a seating portion on which the elastic member 150 is caught may be formed in an inner space so that the elastic member 150 is not separated, and it may be formed to fit the width of the elastic member 150 so as not to deviate in the other direction by the force applied when the elastic member is contracted in a height direction. The elastic member 150 may contract or expand only in a height direction depending on the shape of the inner space.

As described previously, when the heat dissipation member 130 is coupled to the main heat sink 110 through the battery packs 900 and 140, and the like, the pressure being applied to the elastic member 150 is applied to the main heat sink 110, and a force is applied to the main heat sink 110 to the other surface which is an opposite surface to the one surface on which the elastic member 150 is formed, that is, toward the contact surface of the external device so that the main heat sink 110 may maintain contact with the contact surface 310 of the external device.

The shape of the elastic member 150 may vary depending on the size of the internal space being formed in the heat dissipation member 130, but includes an elastic unit 151 that is contracted in a height direction by the applied pressure and a pressure pressing unit 152 for which a force is applied in the direction toward the main heat sink 110. The elastic member 150 may be mounted in the form of one clip in the inner space or may be formed in plurality.

The thickness of the portion of the main heat sink 110 to which the pressure is applied by the elastic member 150 may be formed to be thinner than the thickness of other portions. The thickness of the corresponding position may be formed thinner than the thickness of other parts so as to maintain contact with the contact surface 310 of the external device by the pressure being applied by the elastic member 150. Since the thickness is formed thinner than other portions, the force can be concentrated on the corresponding portion, and because the force is locally applied to the corresponding portion the main heat sink 110 is pushed toward the contact surface 310 of the external device so that the contact can be maintained.

Figure 3:
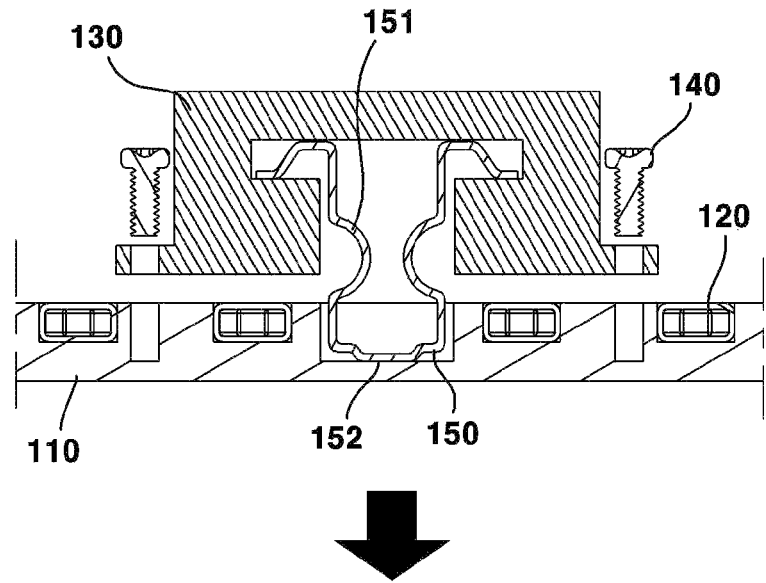
FIG. 3 is a view illustrating before and after shrinkage of the elastic member of the heat sink according to an embodiment of the present invention.
Figure 3:
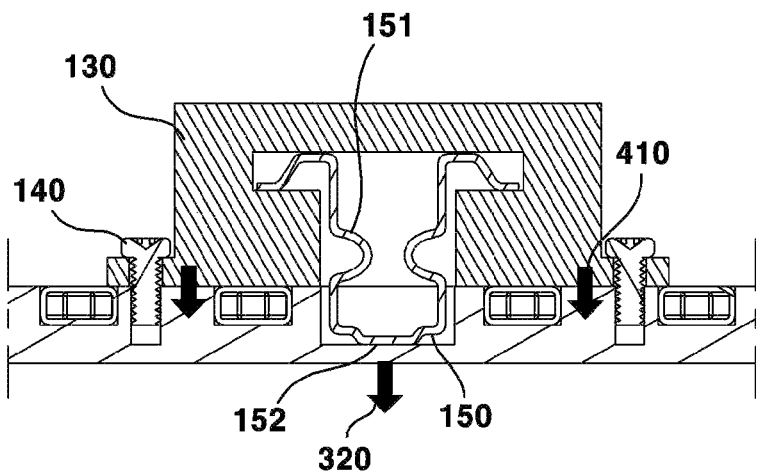
Figure 4:
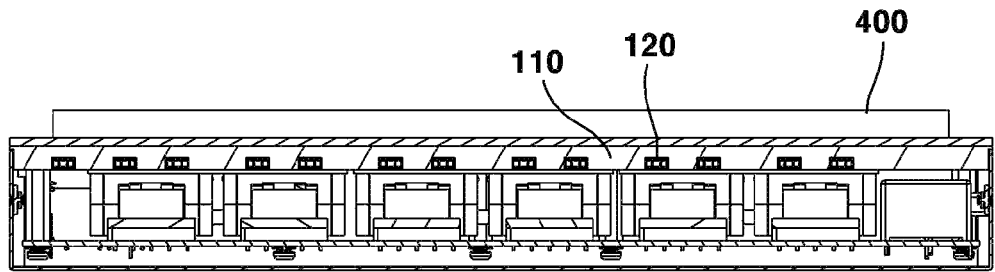
FIGS. 4 and 5 are diagrams for explaining that a heat dissipation fin is being mounted on a heat sink according to an embodiment of the present invention.

FIG. 3 is a diagram for explaining a force applied to the elastic member 150 when the heat dissipation member 130 and the main heat sink 110 are coupled, and as a result, how a force is applied toward the surface opposite to the surface in which the main heat sink 110 is in contact with the elastic member 150.

Before the heat dissipation member 130 is coupled to the main heat sink 110, since no force is applied to the elastic member 150, it is a stable state that neither contracts nor expands, and the elastic unit 151 maintains the original fan shape. The pressure pressing unit 152 also does not apply pressure to the main heat sink 110.

The height of the elastic member 150 in a stable state may be higher than the height of the internal space being formed when the heat dissipation member 130 and the main heat sink 110 are coupled. By the pressure 310 being applied when the heat dissipation member 130 is coupled to the main heat sink 110 using the battery packs 900 and 140, and the like, the elastic member 150 is pressed and the elastic unit 151 is contracted. At this time, the elastic unit 151 may be deformed from a fan shape to an elliptical shape. The force being condensed by the contraction of the elastic unit 151 is applied to the main heat sink 110 through the pressure pressing unit 152, and a force 320 is applied to the main heat sink 110 in a direction toward the other surface. That is, a force is applied in a direction toward the contact surface of the external device, so that the main heat sink 110 may maintain contact with the contact surface of the external device.

Figure 5:
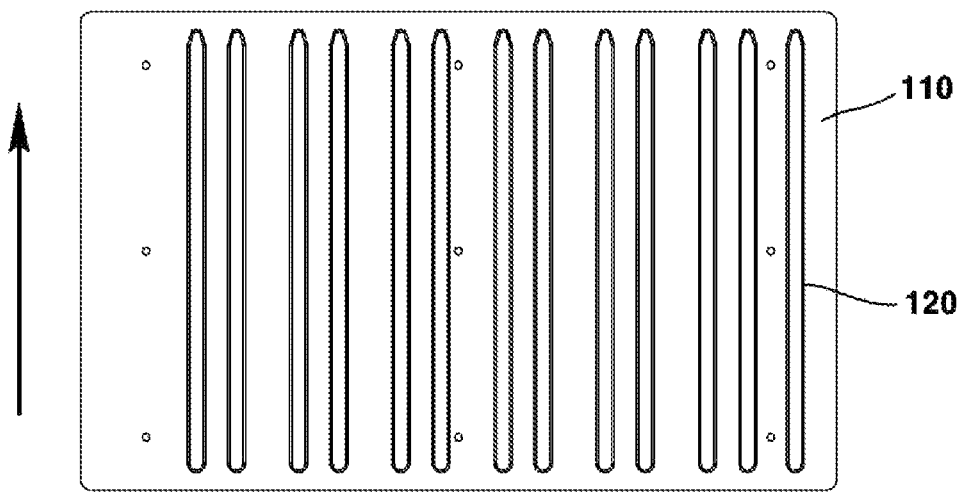
Figure 5:
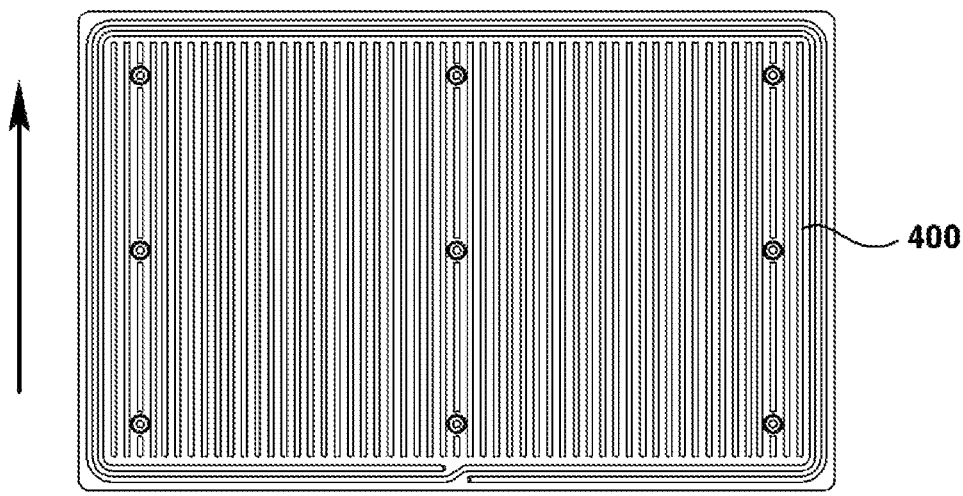

A heat dissipation fin 400 may be disposed on the other surface of the main heat sink 110. As described previously, it can be mounted inside an external device without using the heat dissipation fin 400 using the heat pipe 120, but the heat dissipation fin 400 may be used in order to use an existing structure or to further increase the efficiency of heat dissipation. In the case of using the heat dissipation fin 400, when the arrangement direction of the heat pipe 120 and direction of the fin of the heat dissipation fin 400 are formed perpendicular to each other, since the heat flow can be obstructed, as shown in FIG. 5, by disposing the direction of the heat pipe 120 and direction of the fin of the heat dissipation fin 400 in the same way, the heat dissipation efficiency can be improved by making the directions of heat flow to be the same. That is, the extending direction of the heat dissipation fin 400 may be formed in the same direction as the extending direction of the heat pipe 120.

A converter module 200 according to an embodiment of the present invention comprises: a printed circuit board 210 on which a plurality of components performing voltage conversion are mounted; a heat sink 100 for dissipating heat being generated from the component and becoming a contact surface that comes into contact with an external device when the converter module is mounted on the external device; and a housing for covering the outside of the converter module. Since a detailed description of the heat sink 100 comprising the converter module 200 according to an embodiment of the present invention corresponds to the detailed description of the heat sink 100 according to an embodiment of the present invention previously described with reference to FIGS. 1 to 5, hereinafter, overlapping descriptions will be omitted.

Figure 6:
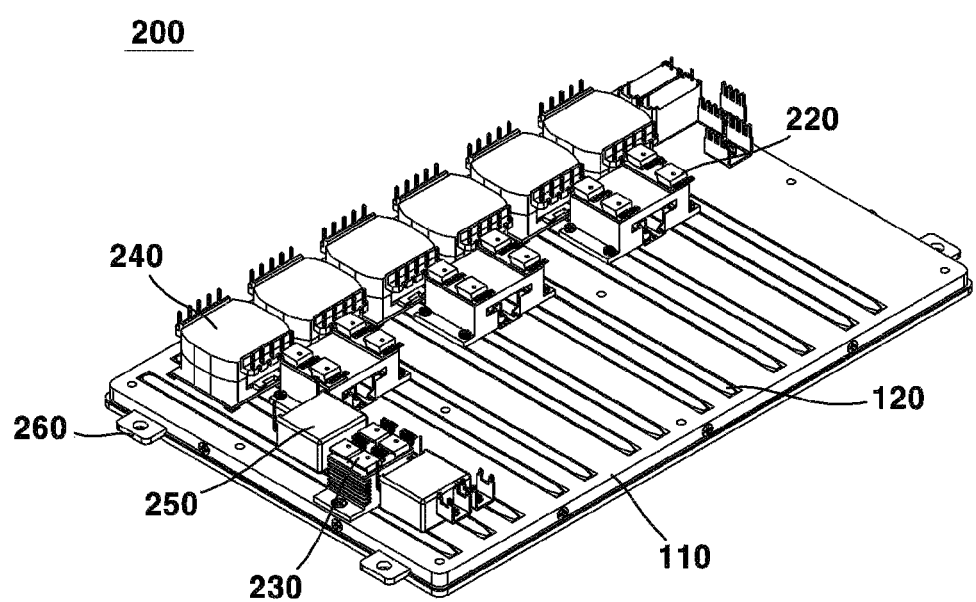
FIGS. 6 and 7 illustrate the inside of a converter module according to an embodiment of the present invention.

The converter module 200 according to an embodiment of the present invention may be formed as a package module on one heat sink 100 as shown in FIG. 6. The converter module 200 may be a DC-DC converter and may include a plurality of components that perform voltage conversion. As shown in FIG. 6, it may include a plurality of coils 240 comprising the transformer and a switch 220 for switching the connection relationship of the coils for voltage conversion, and it may include one or more capacitors 250 and switch 230 and the like, and it may include a connection stage (not shown) being connected to the outside such as a battery. In addition, a coupling portion 260 that can be coupled when the converter module 200 is mounted to an external device may be formed. The converter module 200 may be screw-coupled with an external device using the battery pack 900.

Figure 7:
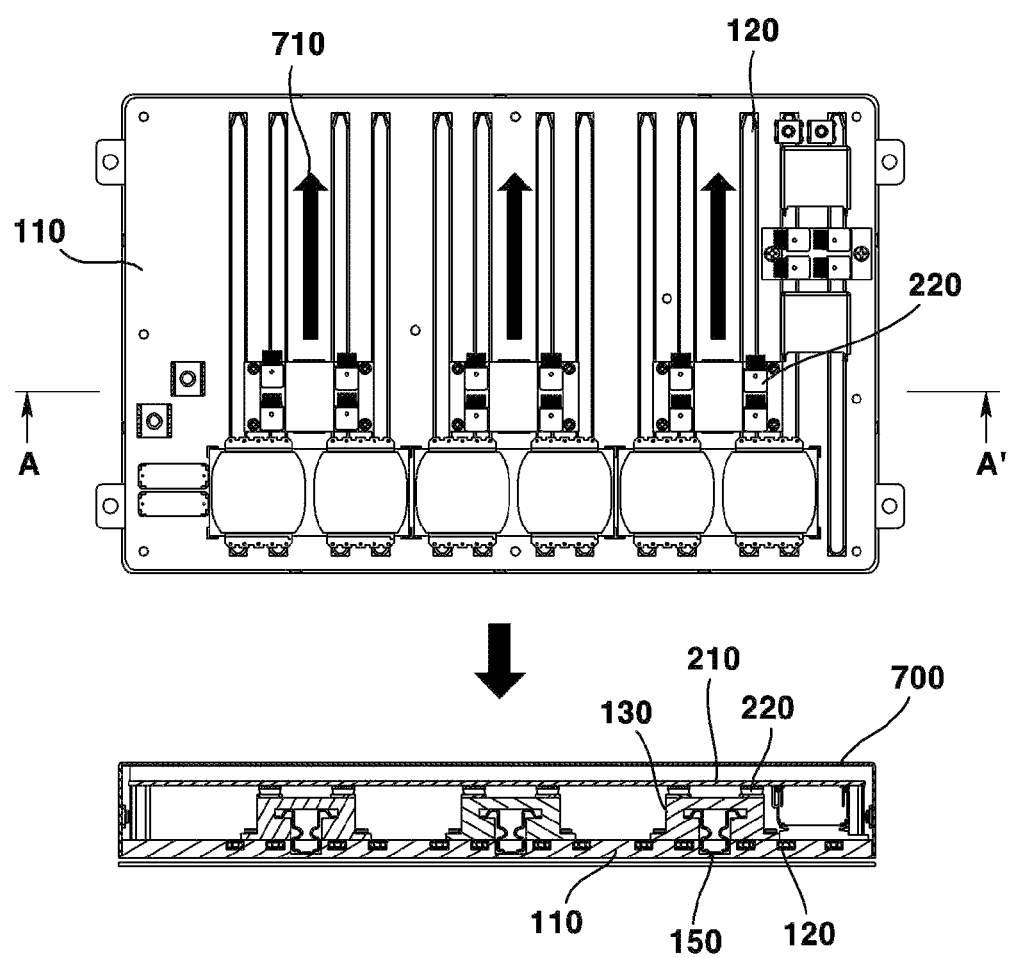

FIG. 7 illustrates a top view of the heat sink 100 in a direction toward an upper portion of a converter module 200 according to an embodiment of the present invention and a cross-sectional view taken along the A-A' cross-section At least some of the plurality of components mounted on the printed circuit board 210 is disposed at a position corresponding to the lower portion when the converter module 200 is mounted on an external device, and the direction of extension of the heat pipe 120 may be disposed in an up and down direction when the converter module 200 is mounted on an external device. That is, in order to increase the efficiency of heat dissipation, heat generation components among the components of the converter module 200 are mainly disposed at a lower side, and in order to transfer the heat being generated by the corresponding heat generation components toward an upper side, the heat pipe 120 being mounted on the heat sink 100 may be disposed so as to be disposed in an up and down direction 710.

Components included in the converter module 200, as shown in the cross-sectional view, are mounted on the printed circuit board 210, and a small heat generation component 220 such as a switch being formed of an FET may be formed to be in contact with a heat sink structure comprising a main heat sink 110, a heat pipe 120, a heat dissipation member 130, and an elastic member 150. Here, the heat sink 100 may comprise: a main heat sink 110; a heat pipe 120 being mounted in a groove being formed in one surface of the main heat sink 110; a heat dissipation member 130 being formed at an upper portion of the heat pipe 120 to transfer heat being generated in the component to the heat pipe 120; and an elastic member 150 being mounted in a space formed inside the heat dissipation member 130 to apply pressure to the main heat sink 110. Here, the main heat sink 110 may come into contact with a contact surface of an external device on which the converter module 200 is mounted by the pressure being applied from the elastic member 150.

The elastic member 150 may include: an elastic unit 151 that is contracted by the pressure being applied when the heat dissipation member 130 and the main heat sink 110 are coupled; and a pressure pressing unit for applying a pressure condensed according to the contraction of the elastic unit 151 to the main heat sink 110. Here, the thickness of the portion of the main heat sink 110 to which the pressure is applied by the elastic member may be formed to be thinner than the thickness of other portions.

Figure 8:
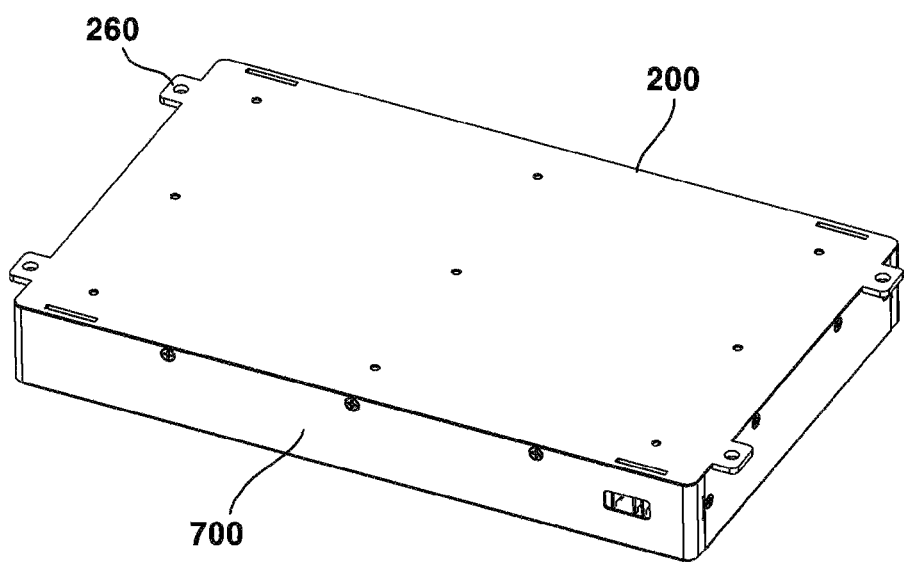
FIG. 8 illustrates a converter module according to an embodiment of the present invention including a housing.

Components of the converter module 200 are formed between the printed circuit board 210 and the heat sink 100, and a housing 700 covering the printed circuit board 210 may be included. The housing 700 and the heat sink 100 of the converter module 200 in which the housing 700 is mounted are seen from the outside as shown in FIG. 8, and they can be installed as one module in an external device such as a battery pack through the coupling portion 260 being formed in the heat sink 100.

Figure 9:
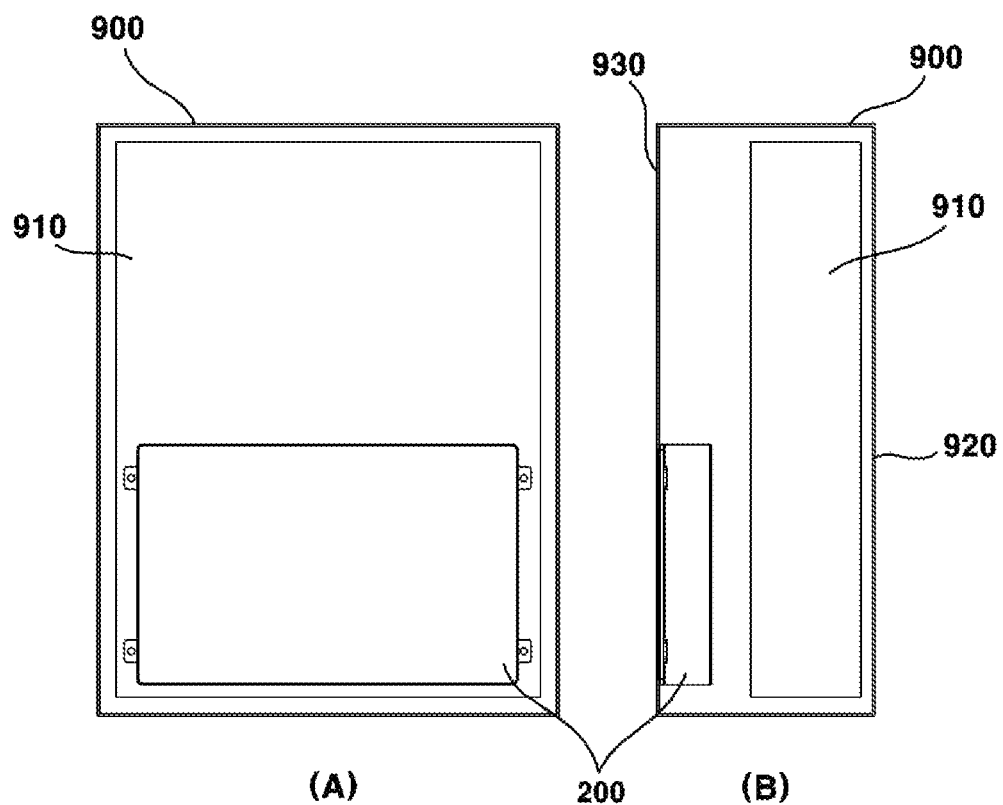
FIGS. 9 (A) and (B) are diagrams illustrating a form in which a converter module according to an embodiment of the present invention is being mounted on a battery pack.

The converter module 200 according to an embodiment of the present invention may comprise a battery pack 900 together with a battery cell 910 as shown in FIG. 9. The converter module 200 is mounted inside the battery pack 900, but it may be disposed at a rear side the battery cell 910. At this time, the converter module 200 may be coupled to the battery pack 900 through four coupling portions 260. The converter module 200 is disposed on a rear surface 930 not on a front surface 920 of the battery pack 900, and the heat sink 100 is also disposed to face the rear surface 930 of the battery pack 900 so that the heat being generated in the converter module 200 is transferred to the heat sink 100 and the rear surface 930 of the battery pack 900 and can be discharged toward the outside. As previously explained, the heat sink 100 is applied with force toward the rear surface 930 of the battery pack 900 by the elastic member 150 being formed in the heat sink 100, and through this, contact with the rear surface 930 of the battery pack 900 is maintained so that it is possible to prevent the heat sink 100 from being separated and the like from the rear surface 930 of the battery pack 900. At this time, the battery pack 900 is disposed at a predetermined distance from the wall surface so that heat may be smoothly dissipated to the back surface of the battery pack 900. Heat dissipation efficiency may be increased by forming heat dissipation fins on an outer surface of the battery pack 900.

As described above, in the present invention, specific matters such as specific components, and the like; and limited embodiments and drawings have been described, but these are only provided to help a more general understanding of the present invention, and the present invention is not limited to the above embodiments, and various modifications and variations are possible from these descriptions by those of ordinary skill in the art to which the present invention belongs.

Therefore, the spirit of the present invention should not be limited to the described embodiments, and not only the claims to be described later, but also all those with equivalent or equivalent modifications to the claims will be said to belong to the scope of the spirit of the present invention.

The invention claimed is:
1. A heat sink comprising:
a main heat sink;
a heat pipe mounted in a groove formed on one surface of the main heat sink;
a heat dissipation member formed at an upper portion of the heat pipe; and
an elastic member mounted in a space formed inside the heat dissipation member for applying pressure to the main heat sink,
wherein the space inside the heat dissipation member is formed in a groove shape and includes a locking step configured to catch the elastic member.
2. The heat sink according to claim 1,
wherein the elastic member comprises:
an elastic unit contracted by a pressure applied when the heat dissipation member and the main heat sink are coupled to each other; and
a pressure pressing unit configured to apply a pressure being condensed according to a contraction of the elastic unit to the main heat sink.
3. The heat sink according to claim 1,
wherein a thickness of a portion of the main heat sink to which pressure is applied by the elastic member is thinner than a thickness of other portions.
4. The heat sink according to claim 1, comprising:
a screw coupling the heat dissipation member and the main heat sink.
5. The heat sink according to claim 1, comprising:
a thermally conductive pad formed at an upper portion of the heat dissipation member to transfer heat generated in the heat generation component to the heat dissipation member.
6. The heat sink according to claim 1, comprising:
a heat dissipation fin disposed in other surface of the main heat sink.
7. The heat sink according to claim 6,
wherein an extension direction of the heat dissipation fin is the same as an extension direction of the heat pipe.
8. The heat sink according to claim 1,
wherein the heat dissipation member transfers heat generated in a heating component to the heat pipe.
9. The heat sink according to claim 8,
wherein the heating component comprises switch.

10. The heat sink according to claim 1,
wherein the elastic member is formed of a metal material having high thermal conductivity.
11. A converter module comprising:
a printed circuit board on which a plurality of components performing voltage conversion are mounted;
a heat sink that serves as a contact surface in contact with an external device when the converter module is mounted on the external device and radiates heat generated in the component; and
a housing covering outside of the converter module,
wherein the heat sink comprises:
a main heat sink;
a heat pipe mounted in a groove formed on one surface of the main heat sink;
a heat dissipation member formed at an upper portion of the heat pipe to transfer heat generated in the component to the heat pipe; and
an elastic member mounted in a space formed inside the heat dissipation member to apply pressure to the main heat sink, and
wherein the main heat sink is in contact with a contact surface of the external device to which the converter module is mounted by the pressure applied from the elastic member, and
wherein the space inside the heat dissipation member is formed in a groove shape and includes a seating portion configured to catch the elastic member.
12. The converter module according to claim 11,
wherein at least some components among the plurality of components is disposed at a position corresponding to a lower portion when the converter module is mounted on the external device, and
wherein an extension direction of the heat pipe is disposed in an up and down direction when the converter module is mounted on the external device.
13. The converter module according to claim 11,
wherein the elastic member comprises:
an elastic unit contracted by pressure applied when the heat dissipation member and the main heat sink are coupled; and
a pressure pressing unit configured to apply a pressure being condensed according to a contraction of the elastic unit to the main heat sink.
14. The converter module according to claim 11,
wherein a thickness of a portion of the main heat sink to which pressure is applied by the elastic member is thinner than a thickness of other portions.
15. The converter module according to claim 11,
wherein a thickness of a portion of the main heat sink to which pressure is applied by the elastic member is thinner than a thickness of other portions.
16. The converter module according to claim 11,
wherein the converter module comprises a thermally conductive pad formed at an upper portion of the heat dissipation member to transfer heat generated in the heat generation component to the heat dissipation member.
17. The converter module according to claim 11,
wherein the converter module comprises a heat dissipation fin disposed in other surface of the main heat sink.
18. The converter module according to claim 17,
wherein an extension direction of the heat dissipation fin is the same as an extension direction of the heat pipe.
19. The converter module according to claim 11,
wherein the heat dissipation member transfers heat generated in a heating component to the heat pipe.

20. A battery pack comprising:
a battery cell; and
a converter module according to claim 11 and disposed in the battery pack.

* * * * *